(12) United States Patent
Tang et al.

(10) Patent No.: US 11,676,751 B2
(45) Date of Patent: Jun. 13, 2023

(54) MAGNETIC DEVICE

(71) Applicant: TDK CORPORATION, Tokyo (JP)

(72) Inventors: Zhenyao Tang, Tokyo (JP); Yohei Shiokawa, Tokyo (JP); Tomoyuki Sasaki, Tokyo (JP)

(73) Assignee: TDK CORPORATION, Tokyo (JP)

(*) Notice: Subject to any disclaimer, the term of this patent is extended or adjusted under 35 U.S.C. 154(b) by 131 days.

(21) Appl. No.: 17/188,511

(22) Filed: Mar. 1, 2021

(65) Prior Publication Data
US 2022/0277877 A1 Sep. 1, 2022

(51) Int. Cl.
*H01F 10/32* (2006.01)
*G11C 11/15* (2006.01)
*G01R 33/09* (2006.01)

(52) U.S. Cl.
CPC ......... *H01F 10/329* (2013.01); *G01R 33/091* (2013.01); *G11C 11/15* (2013.01); *H01F 10/3254* (2013.01)

(58) Field of Classification Search
None
See application file for complete search history.

(56) References Cited

U.S. PATENT DOCUMENTS

| | | | |
|---|---|---|---|
| 8,836,000 B1 | 9/2014 | Lin | |
| 9,184,375 B1 | 11/2015 | Tang et al. | |
| 11,551,736 B2 * | 1/2023 | Chuang | H01L 43/12 |
| 2008/0304353 A1 | 12/2008 | Abraham et al. | |
| 2011/0089511 A1 | 4/2011 | Keshtbod et al. | |
| 2011/0260272 A1 | 10/2011 | Lee et al. | |
| 2015/0171315 A1 | 6/2015 | Gan et al. | |
| 2016/0233417 A1 | 8/2016 | Lee et al. | |
| 2018/0182841 A1 * | 6/2018 | Sturcken | H01L 21/2885 |
| 2020/0194311 A1 | 6/2020 | Tang et al. | |
| 2021/0027832 A1 * | 1/2021 | Wang | H01L 27/10823 |
| 2021/0264959 A1 * | 8/2021 | Rabkin | H01L 29/778 |
| 2022/0036932 A1 * | 2/2022 | Chuang | H01L 27/222 |

FOREIGN PATENT DOCUMENTS

JP 2017-216286 A 12/2017

\* cited by examiner

*Primary Examiner* — Kevin M Bernatz
(74) *Attorney, Agent, or Firm* — Oliff PLC

(57) ABSTRACT

A magnetic device is equipped with a stacked body including a first ferromagnetic layer, a second ferromagnetic layer, and a non-magnetic layer sandwiched between the first ferromagnetic layer and the second ferromagnetic layer; and an insulator which covers at least a part of side surfaces of the stacked body, in which the insulator has a space outside the side surface of the stacked body.

12 Claims, 14 Drawing Sheets

MAGNETIC DEVICE

BACKGROUND OF THE INVENTION

Field of the Invention

The present invention relates to a magnetic device.

Description of Related Art

Giant magnetoresistance (GMR) elements consisting of a multilayer film of a ferromagnetic layer and a non-magnetic layer, and tunnel magnetoresistance (TMR) elements using an insulating layer (a tunnel barrier layer, a barrier layer) as a non-magnetic layer are known as magnetoresistance effect elements. Magnetoresistance effect elements can be applied to a magnetic sensor, a radio frequency component, a magnetic head, and a non-volatile random access memory (MRAM).

The MRAM is a storage element in which magnetoresistance effect elements are integrated. The MRAM reads and writes data by utilizing the characteristic that the resistance of the magnetoresistance effect element changes when mutual directions of magnetization of two ferromagnetic layers sandwiching the non-magnetic layer in the magnetoresistance effect elements change.

For example, Japanese Unexamined Patent Application, First Publication No. 2017-216286 describes a magnetoresistance effect element that performs writing by the use of a spin-orbit torque (SOT).

SUMMARY OF THE INVENTION

The magnetoresistance effect element may generate heat when writing data. The heat generated by the magnetoresistance effect element can cause an adverse effect on a control element, other magnetoresistance effect elements, and the like.

The present invention has been made in view of the above circumstances, and an object of the present invention is to provide a magnetic device capable of reducing the influence of heat generated by a magnetoresistance effect element on other elements.

The present invention provides the following means for solving the aforementioned problems.

(1) The magnetic device according to a first aspect is equipped with a stacked body including a first ferromagnetic layer, a second ferromagnetic layer, and a non-magnetic layer sandwiched between the first ferromagnetic layer and the second ferromagnetic layer; and an insulator which covers at least a part of side surface of the stacked body, in which the insulator may have a space outside the side surface of the stacked body.

(2) In the magnetic device according to the aforementioned aspect, a plurality of spaces may exist inside the insulator, and the stacked body may be sandwiched between the two spaces in a first direction.

(3) The magnetic device according to the aforementioned aspect may further include a wiring connected to the stacked body, in which the wiring may extend in the first direction.

(4) In the magnetic device according to the aforementioned aspect, the space may surround the side surface of the stacked body.

(5) In the magnetic device according to the aforementioned aspect the space may be in contact with the stacked body.

(6) The magnetic device according to the aforementioned aspect may further include an electrode connected to the stacked body, in which the space may be in contact with the electrode.

(7) The magnetic device according to the aforementioned aspect may have a plurality of the stacked bodies, and the space may be located between two stacked bodies among the plurality of stacked bodies.

(8) In the magnetic device according to the aforementioned aspect, the space may be located between the closest stacked bodies.

DETAILED DESCRIPTION OF THE INVENTION

Figure 1:
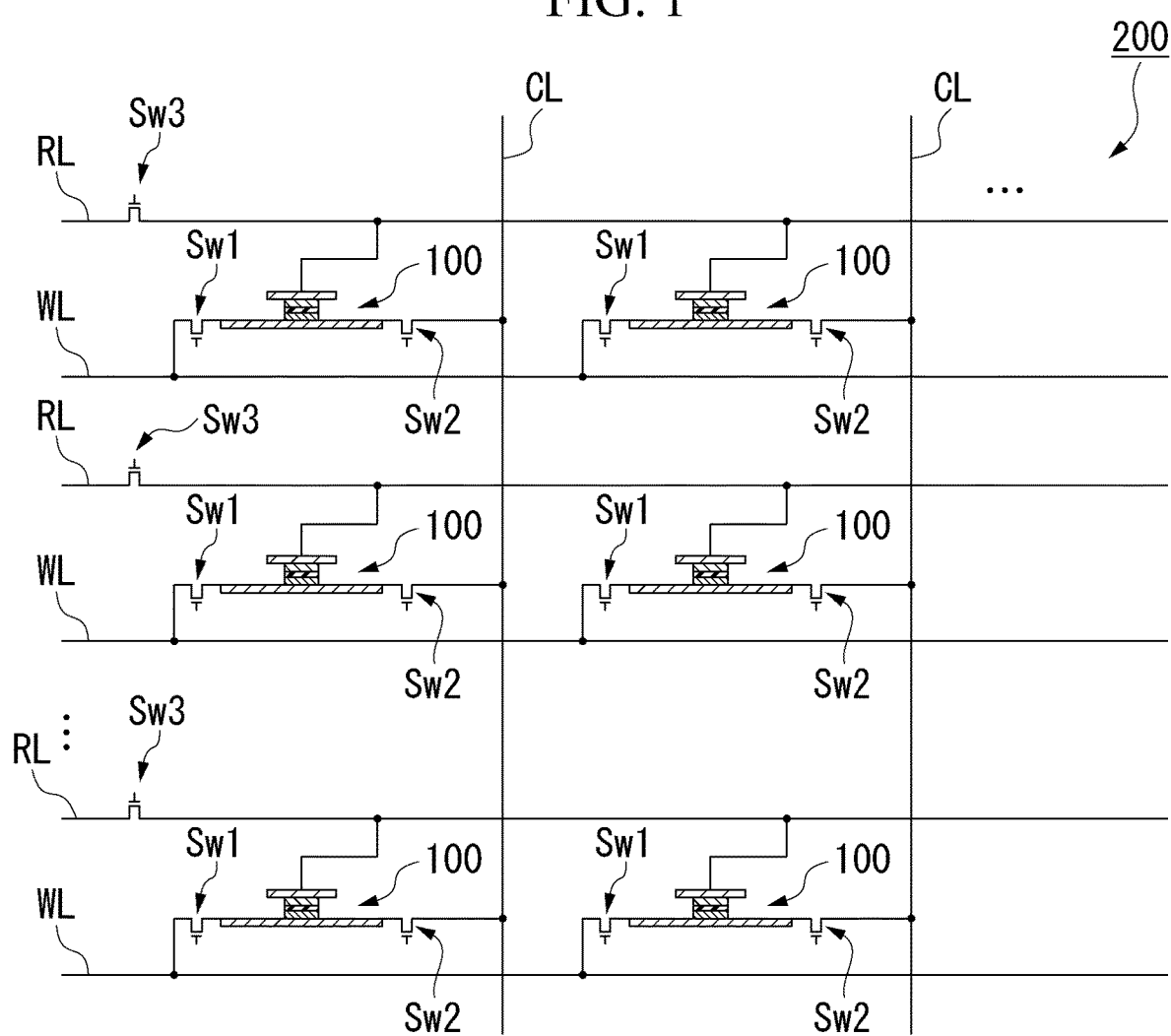
FIG. 1 is a schematic view of a magnetic device according to a first embodiment.

Hereinafter, the present embodiment will be described in detail while referring to the drawings as appropriate. In the drawings used in the following description, in some cases, featured portions may be enlarged for convenience to make the features easy to understand, and dimensional ratios or the like of respective components may be different from the actual ones. The materials, dimensions, and the like exemplified in the following description are examples, and the present invention is not limited thereto, and can be appropriately modified and realized within the range in which the effects of the present invention are exhibited.

First, directions will be defined. One direction along one surface of a substrate Sub (see FIG. 2) to be described below is defined as an x direction, and a direction orthogonal to the x direction is defined as a y direction. The x direction is, for example, a direction from an electrode 31 toward an electrode 32. A z direction is a direction orthogonal to the x direction and the y direction. The z direction is an example of a stacking direction. A direction from the substrate Sub toward a magnetoresistance effect element 100 is defined as a +z direction. Hereinafter, in some cases, the +z direction may be expressed as "upward" and a −z direction may be expressed as "downward". Hereinafter, upward and downward do not always coincide with a direction in which gravity acts.

In the present specification, the expression "extending in the x direction" means, for example, that a dimension in the x direction is larger than a minimum dimension among dimensions in the x direction, the y direction, and the z direction. The same also applies to a case of extending in the other direction.

First Embodiment

FIG. 1 is a configuration diagram of a magnetic device 200 according to a first embodiment. The magnetic device 200 is equipped with a plurality of magnetoresistance effect elements 100, a plurality of writing lines WL, a plurality of common lines CL, a plurality of reading lines RL, a plurality of first switching elements Sw1, a plurality of second switching elements Sw2, and a plurality of third switching elements Sw3. The magnetic device 200 can be used for a spin memristor, a magnetic memory, an IoT device, a neuromorphic device, and the like.

The magnetoresistance effect elements 100 are arranged, for example, in a matrix form. Each of the magnetoresistance effect elements 100 is connected to one of the writing lines WL, the reading lines RL, and the common lines CL.

The writing line WL electrically connects a power supply and one or more magnetoresistance effect elements 100. The common line CL is a wiring that is used both when writing data and when reading data. The common line CL electrically connects a reference potential and one or more magnetoresistance effect elements 100. The reference potential is, for example, a ground. The common line CL may be provided for each of the plurality of magnetoresistance effect elements 100, or may be provided over a plurality of magnetoresistance effect elements 100. The reading line RL electrically connects the power supply and one or more magnetoresistance effect elements 100. The power supply is connected to the magnetic device 200 during use.

Each magnetoresistance effect element 100 is connected to one of the first switching elements Sw1, the second switching elements Sw2, and the third switching elements Sw3. The first switching element Sw1 is connected between the magnetoresistance effect element 100 and the writing line WL. The second switching element Sw2 is connected between the magnetoresistance effect element 100 and the common line CL. The third switching element Sw3 is connected to the reading line RL extending over a plurality of magnetoresistance effect elements 100.

When the first switching element Sw1 and the second switching element Sw2 are turned on, a writing current flows between the writing line WL connected to the predetermined magnetoresistance effect element 100 and the common line CL. When a writing current flows through the magnetoresistance effect element 100, data is recorded in the magnetoresistance effect element 100. When the second switching element Sw2 and the third switching element Sw3 are turned on, a reading current flows between the common line CL connected to the predetermined magnetoresistance effect element 100 and the reading line RL. When a reading current flows through the magnetoresistance effect element 100, data is read from the magnetoresistance effect element 100.

The first switching element Sw1, the second switching element Sw2, and the third switching element Sw3 are elements that control the flow of current. The first switching element Sw1, the second switching element Sw2, and the third switching element Sw3 are, for example, a transistor, an element such as an ovonic threshold switch (OTS) that utilizes a phase change of a crystal layer, an element such as a metal insulator transition (MIT) switch that utilizes a change in band structure, an element such as a Zener diode and an avalanche diode that utilizes a breakdown voltage, and an element whose conductivity changes with a change in atomic position.

In the magnetic device 200 shown in FIG. 1, the magnetoresistance effect elements 100 connected to the same wiring share the third switching element Sw3. The third switching elements Sw3 may be provided for each magnetoresistance effect element 100. Further, the third switching elements Sw3 may be provided for each magnetoresistance effect element 100, and the first switching elements Sw1 or the second switching elements Sw2 may be shared by the magnetoresistance effect elements 100 connected to the same wiring.

Figure 2:
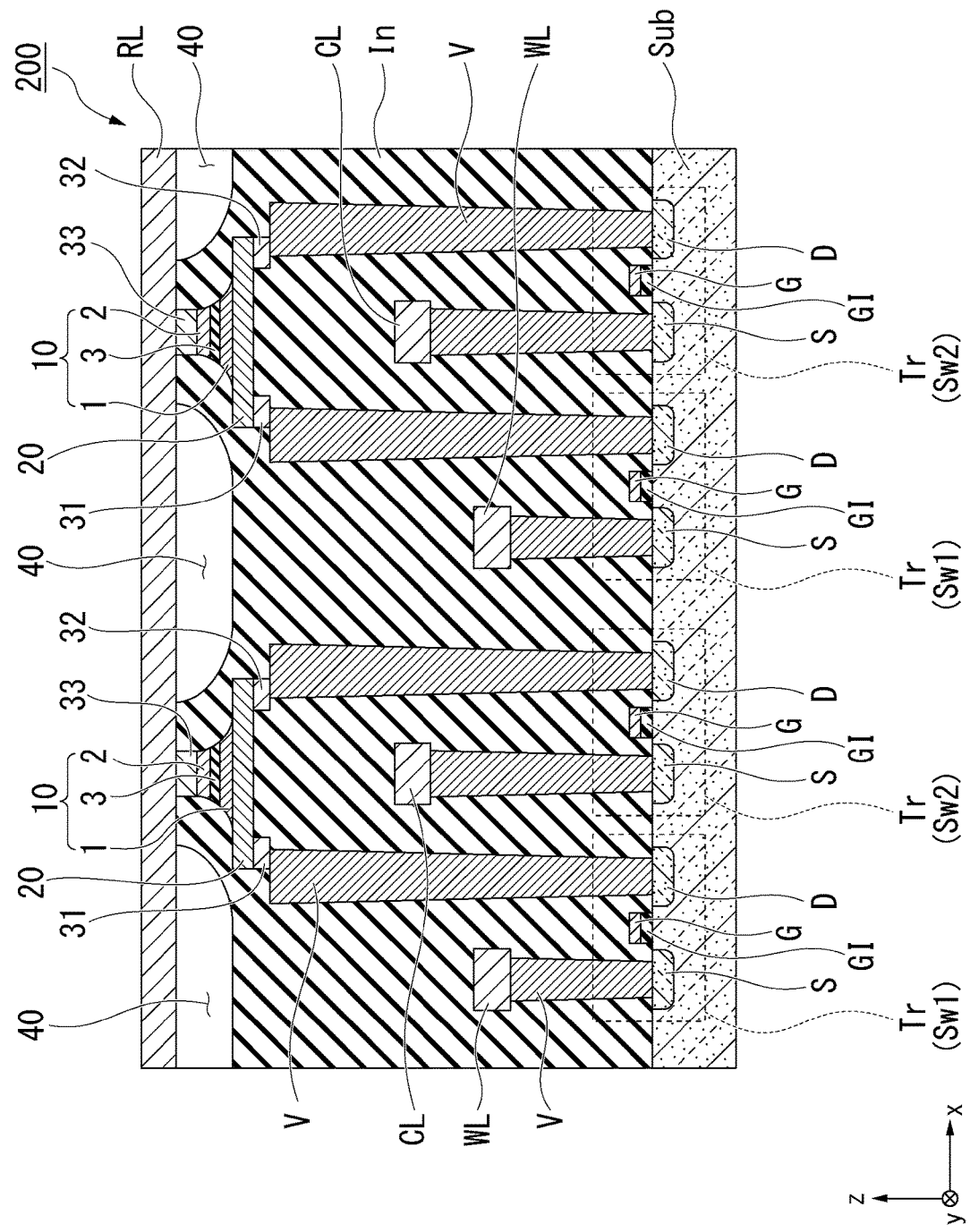
FIG. 2 is a cross-sectional view of the magnetic device according to the first embodiment.

FIG. 2 is a cross-sectional view of the magnetic device 200 according to the first embodiment. FIG. 2 is a cross section of the magnetic device 200 taken along an xz plane passing through a center of a width of a spin-orbit torque wiring 20 to be described below in the y direction.

The first switching element Sw1 and the second switching element Sw2 shown in FIG. 2 are transistors Tr. The third switching element Sw3 is connected to the reading line RL, and is located, for example, at a different position in the x direction of FIG. 2. The transistor Tr is, for example, a field effect type transistor, and has a gate electrode G, a gate insulating film GI, and a source S and a drain D formed on the substrate Sub. This positional relationship between the source S and the drain D is an example, and it may be reversed. The substrate Sub is, for example, a semiconductor substrate.

The transistor Tr and the magnetoresistance effect element 100 are electrically connected to each other via a via wiring V and electrodes 31 and 32. Further, the transistor Tr and the writing line WL or the common line CL are connected to each other by the via wiring V. Further, the reading line RL and the magnetoresistance effect element 100 are electrically connected to each other via an electrode 33. The via wiring V and the electrodes 31, 32 and 33 include a conductive material.

The periphery of the magnetoresistance effect element 100 and the transistor Tr is covered with an insulator In. The insulator In is an insulating layer that insulates between the wirings of the multilayer wiring or between the elements. The insulator In is, for example, silicon oxide ($SiO_x$), silicon nitride (SiN$_x$), silicon carbide (SiC), chromium nitride, silicon carbonitride (SiCN), silicon oxynitride (SiON), aluminum oxide (Al$_2$O$_3$), zirconium oxide (ZrO$_x$) and the like.

There is a space 40 in the insulator In. The space 40 is a portion surrounded by the insulator In. There are a plurality of spaces 40, for example, in the insulator In. The space 40 is located, for example, above the electrodes 31 and 32. The inside of the space 40 is filled with a vacuum or a gas, and the periphery of the space 40 is surrounded by a solid substance.

A vacuum has poor thermal conductivity. In the case there is a vacuum inside the space 40, the effect of heat generated by the element is unlikely to be transmitted to other elements. Further, even if the space 40 is filled with a gas, if the pressure of the gas is sufficiently small, the heat conduction becomes small, and it is possible to obtain the same effect as a case where there is a vacuum in the space 40. Further, the inside of the space 40 may be filled with a liquid. Since the periphery of the space 40 is surrounded by a solid substance, it can be filled with a liquid. A liquid has a poorer thermal conductivity than a solid, and is less likely to transmit the effect of heat generated by an element to other elements. Further, in the case a liquid is used inside the space 40, slow heat conduction through the space 40 can be maintained. As a result, heat can be quickly removed from the heat-generating element after a process involving heat generation such as writing. Prompted the removal of heat from the element improves data retention characteristics are enhances the stability of data writing.

Figure 3:
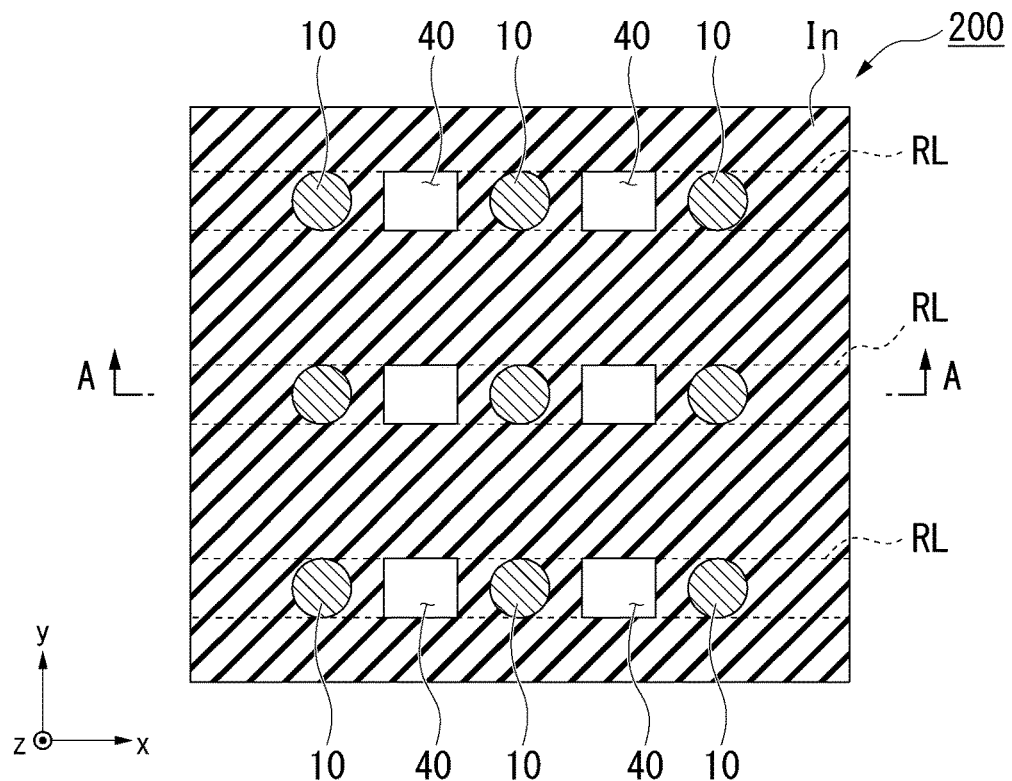
FIG. 3 is another cross-sectional view of the magnetic device according to the first embodiment.

FIG. 3 is another cross-sectional view of the magnetic device 200 according to the first embodiment. FIG. 3 is a cross-sectional view of the magnetic device 200 taken along an xy plane passing through the first ferromagnetic layer 1 of a stacked body 10.

In the xy plane, the stacked bodies 10 constituting the magnetoresistance effect elements 100 are arranged in a matrix form. The space 40 is located between two stacked bodies 10 among the plurality of stacked bodies 10. In the example shown in FIG. 3, the space 40 is located between the stacked bodies 10 adjacent to each other in the x direction. The space 40 may be located, for example, between the closest stacked bodies 10.

Figure 4:
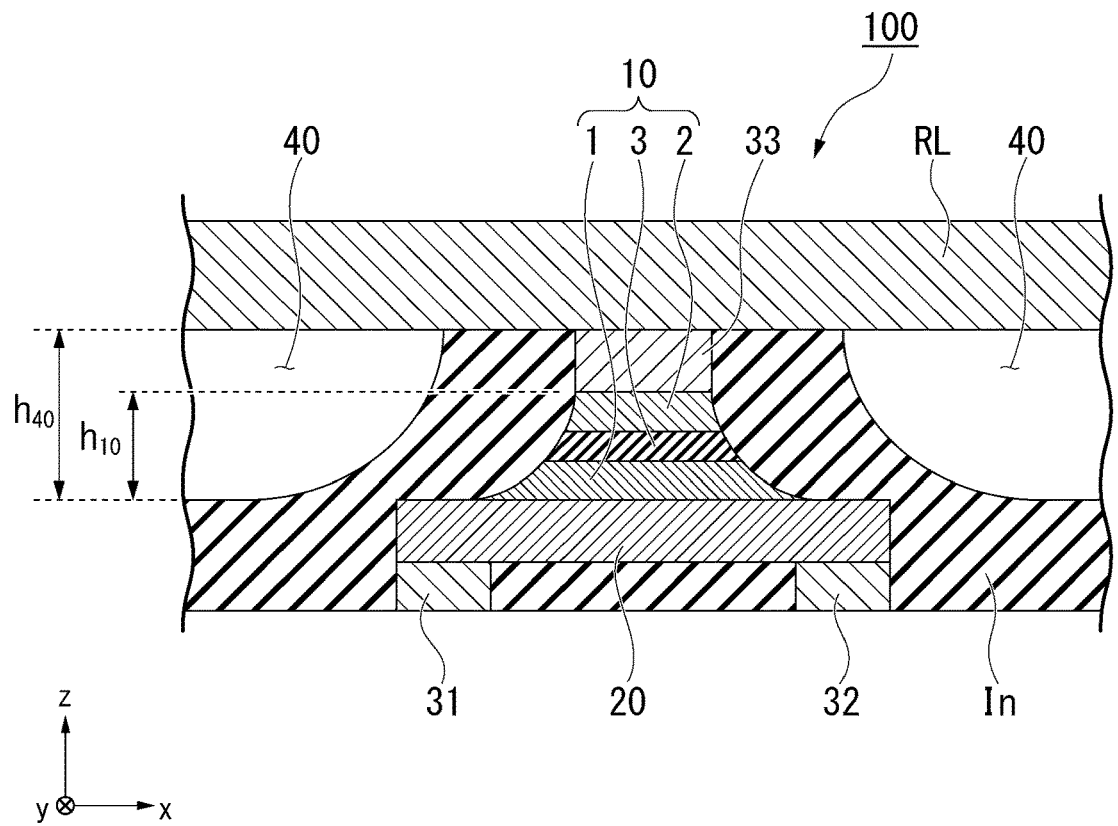
FIG. 4 is an enlarged cross-sectional view of the vicinity of a magnetoresistance effect element of the magnetic device according to the first embodiment.

FIG. 4 is an enlarged cross-sectional view of the vicinity of the magnetoresistance effect element 100 of the magnetic device 200 according to the first embodiment. FIG. 4 is a cross section of the magnetoresistance effect element 100 taken in the xz plane passing through the center of the width of the spin-orbit torque wiring 20 in the y direction.

The magnetoresistance effect element 100 is equipped with, for example, the stacked body 10 and the spin-orbit torque wiring 20. A resistance value of the stacked body 10 in the z direction changes when a spin is injected into the stacked body 10 from the spin-orbit torque wiring 20. The magnetoresistance effect element 100 is a magnetoresistance effect element that utilizes a spin-orbit torque (SOT), and may be referred to as a spin-orbit torque type magnetoresistance effect element, a spin injection type magnetoresistance effect element, or a spin current magnetoresistance effect element.

The magnetoresistance effect element 100 is a three-terminal type element to which three electrodes 31, 32, and 33 are connected. The electrodes 31, 32, and 33 are made of a conductive material. The electrodes 31, 32, and 33 include any selected from a group consisting of, for example, Al, Cu, Ta, Ti, Zr, NiCr, and nitrides (e.g., TiN, TaN, and SiN). The electrode 33 may also serve as a hard mask used in the manufacturing process of the magnetoresistance effect element 100. The electrode 33 may be made of, for example, a transparent electrode material.

The electrode 31 and the electrode 32 are connected to the spin-orbit torque wiring 20 at a position where the stacked body 10 is sandwiched in the x direction in a plan view from the z direction. The electrode 33 is connected to the stacked body 10. The stacked body 10 is connected to the reading line RL via the electrode 33. The reading line RL extends in the x direction. The space 40 is located at a position where it overlaps the reading line RL, for example, when viewed in the z direction.

The space 40 is located in the insulator In that covers the periphery of the stacked body 10. The space 40 is located outside the side surface of the stacked body 10. The insulator In is located between the space 40 and the stacked body 10. The space 40, for example, sandwiches the stacked body 10 in the x direction. In the example of FIG. 4, the space 40 is located above the upper surface of the spin-orbit torque wiring 20 in the z direction. The inside of the space 40 is, for example, the atmosphere or a vacuum.

A height $h_{40}$ of the space 40 in the z direction is, for example, equal to or higher than a height $h_{10}$ of the stacked body 10 in the z direction. The height $h_{40}$ of the space 40 in the z direction is greater than, for example, the height $h_{10}$ of the stacked body 10 in the z direction. The surface of the space 40 facing the side surface of the stacked body 10 is, for example, curved. An inclination direction of a curved surface of the space 40 in the z direction is, for example, the same as an inclination direction of the side surface of the stacked body 10 facing the curved surface in the z direction. In the space 40, for example, the upper surface is wider than the lower surface, and the upper surface and the lower surface are connected by a curved surface.

The stacked body 10 is sandwiched between the spin-orbit torque wiring 20 and the electrode 33 in the z direction. The stacked body 10 is a columnar body. A shape of the stacked body 10 from the z direction when viewed in a plan view is, for example, a circle, an ellipse, or a quadrangle. The side surface of the stacked body 10 is, for example, inclined with respect to the z direction.

The stacked body 10 has, for example, a first ferromagnetic layer 1, a second ferromagnetic layer 2, and a non-magnetic layer 3. The first ferromagnetic layer 1 is in contact with, for example, the spin-orbit torque wiring 20 and is stacked on the spin-orbit torque wiring 20. Spin is injected into the first ferromagnetic layer 1 from the spin-orbit torque wiring 20. The magnetization of the first ferromagnetic layer 1 receives a spin-orbit torque (SOT) due to the injected spin, and an orientation direction thereof changes. The first ferromagnetic layer 1 and the second ferromagnetic layer 2 sandwich the non-magnetic layer 3 in the z direction.

The first ferromagnetic layer 1 and the second ferromagnetic layer 2 each have magnetization. The magnetization of the second ferromagnetic layer 2 is less likely to change in the orientation direction than the magnetization of the first ferromagnetic layer 1 when a predetermined external force is applied. The first ferromagnetic layer 1 may be called a magnetization free layer, and the second ferromagnetic layer 2 may be called a magnetization fixed layer or a magnetization reference layer. A resistance value of the stacked body 10 changes, depending on a difference in relative angles of magnetization between the first ferromagnetic layer 1 and the second ferromagnetic layer 2 sandwiching the non-magnetic layer 3.

The first ferromagnetic layer 1 and the second ferromagnetic layer 2 include a ferromagnetic material. The ferromagnetic material is, for example, a metal selected from a group consisting of Cr, Mn, Co, Fe and Ni, an alloy containing one or more of these metals, and an alloy containing these metals and at least one or more of B, C, and N. The ferromagnetic material is, for example, Co—Fe, Co—Fe—B, Ni—Fe, a Co—Ho alloy, a Sm—Fe alloy, an Fe—Pt alloy, a Co—Pt alloy, or a CoCrPt alloy.

The first ferromagnetic layer 1 and the second ferromagnetic layer 2 may contain a Heusler alloy. A Heusler alloy includes an intermetallic compound with a chemical composition of XYZ or $X_2YZ$. X is a transition metal element or a noble metal element from the Co, Fe, Ni, or Cu groups in the periodic table, Y is a transition metal of the Mn, V, Cr or Ti groups, or the same type of element as X, and Z is a typical element from Group III to Group V. The Heusler alloy is, for example, $Co_2FeSi$, $Co_2FeGe$, $Co_2FeGa$, $Co_2MnSi$, $Co_2Mn_{1-a}Fe_aAl_bSi_{1-b}$, $Co_2FeGe_{1-c}Ga_c$ and the like. A Heusler alloy have a high spin polarizability.

The non-magnetic layer 3 contains a non-magnetic material. When the non-magnetic layer 3 is an insulator (when it is a tunnel barrier layer), for example, $Al_2O_3$, $SiO_2$, MgO, $MgAl_2O_4$ and the like can be used as the material thereof. In addition to these, it is also possible to use a material in which a part of Al, Si, and Mg is replaced with Zn, Be, and the like. Among these, since MgO and $MgAl_2O_4$ are materials that can realize a coherent tunnel, in this case spin can be efficiently injected. In the case the non-magnetic layer 3 is a metal, Cu, Au, Ag or the like can be used as the material thereof. Further, in the case the non-magnetic layer 3 is a semiconductor, Si, Ge, $CuInSe_2$, $CuGaSe_2$, Cu (in, Ga) See and the like can be used as the material thereof.

The stacked body 10 may have layers other than the first ferromagnetic layer 1, the second ferromagnetic layer 2, and the non-magnetic layer 3. For example, a base layer may be provided between the spin-orbit torque wiring 20 and the first ferromagnetic layer 1. The base layer enhances the crystallinity of each layer constituting the stacked body 10. Further, for example, a cap layer may be provided on the uppermost surface of the stacked body 10.

Further, the stacked body 10 may be provided with a ferromagnetic layer on the surface of the second ferromagnetic layer 2 away from the non-magnetic layer 3 with a spacer layer therebetween. The second ferromagnetic layer 2, the spacer layer, and the ferromagnetic layer have a synthetic antiferromagnetic structure (SAF structure). A synthetic antiferromagnetic structure consists of two magnetic layers sandwiching the non-magnetic layer. The antiferromagnetic coupling between the second ferromagnetic layer 2 and the ferromagnetic layer increases the coercive force of the second ferromagnetic layer 2 as compared with a case of having no ferromagnetic layer. The ferromagnetic layer is, for example, IrMn, PtMn, or the like. The spacer layer contains, for example, at least one selected from the group consisting of Ru, Ir, and Rh.

The spin-orbit torque wiring 20 extends, for example, in the x direction. The writing current flows along the spin-orbit torque wiring 20. At least a part of the spin-orbit torque wiring 20 together with the non-magnetic layer 3 sandwiches the first ferromagnetic layer 1 in the z direction.

The spin-orbit torque wiring 20 generates a spin current by a spin Hall effect when the current I flows, and injects spin into the first ferromagnetic layer 1. The spin-orbit torque wiring 20 applies, for example, a spin-orbit torque (SOT), which is sufficient to reverse the magnetization of the first ferromagnetic layer 1, to the magnetization of the first ferromagnetic layer 1. The spin Hall effect is a phenomenon in which a spin current is induced in a direction orthogonal to the direction in which a current flows, on the basis of the spin-orbit interaction when the current flows. The spin Hall effect is the same as a normal Hall effect in that moving charges (electrons) are bent in a motion (moving) direction. In the normal Hall effect, the motion direction of charged particles moving in a magnetic field is bent by a Lorentz force. On the other hand, in the spin Hall effect, even in the absence of a magnetic field, the movement direction of spin is bent only by the movement of electrons (only the flow of current).

For example, when a current flows through the spin-orbit torque wiring 20, a first spin oriented in one direction and a second spin oriented in a direction opposite to the first spin are each bent by a spin Hall effect in the direction orthogonal to the direction in which the current flows. For example, the first spin oriented in a −y direction is bent in a +z direction, and the second spin oriented in a +y direction is bent in a −z direction.

In a non-magnetic material (a material that is not a ferromagnetic material), the number of electrons of the first spin and the number of electrons of the second spin generated by the spin Hall effect are equal. That is, the number of electrons of the first spin oriented in the +z direction is equal to the number of electrons of the second spin oriented in the −z direction. The first spin and the second spin flow in a direction in which uneven distribution of spins is eliminated. In the movement of the first spin and the second spin in the z direction, because the flows of charge cancel each other out, the amount of current becomes zero. A spin current with no current is particularly called a pure spin current.

When the flow of electrons of the first spin is expressed by $J\uparrow$, the flow of electrons of the second spin is expressed by $J\downarrow$, and the spin current is expressed by $J_S$, $J_S = J\uparrow - J\downarrow$, is defined. The spin current $J_S$ occurs in the z direction. The first spin is injected into the first ferromagnetic layer 1 from the spin-orbit torque wiring 20.

The spin-orbit torque wiring 20 contains any one of metals, alloy, intermetallic compounds, metal borides, metal carbides, metal silicides, and metal phosphides having a function of generating a spin current by the spin Hall effect when the current I flows.

The spin-orbit torque wiring 20 contains, for example, a non-magnetic heavy metal as a main component. The heavy metal means a metal having a specific gravity of that of yttrium (Y) or more. The non-magnetic heavy metal is, for example, a non-magnetic metal having d-electrons or f-electrons in the outermost shell and having a high atomic number which is 39 or greater. The spin-orbit torque wiring 20 is made up of, for example, Hf, Ta, and W. Non-magnetic heavy metals have stronger spin-orbit interaction than other metals. The spin Hall effect is generated by the spin-orbit interaction, and the spins are likely to be unevenly distributed in the spin-orbit torque wiring 20, and the spin current $J_S$ is likely to occur.

The spin-orbit torque wiring 20 may also contain a magnetic metal. The magnetic metal is a ferromagnetic metal or an antiferromagnetic metal. A small amount of magnetic metal contained in the non-magnetic material becomes a spin scattering factor. The small amount is, for example, 3% or less of a total of molar proportions of the elements constituting the spin-orbit torque wiring 20. When the spins are scattered by the magnetic metal, the spin-orbit interaction is enhanced, and the efficiency of generation of spin current with respect to the current is increased.

The spin-orbit torque wiring 20 may include a topological insulator. The topological insulator is a substance in which the inside of the substance is an insulator or a high resistor, but a spin-polarized metallic state occurs on the surface thereof. In the topological insulator, an internal magnetic field occurs by the spin-orbit interaction. The topological insulator develops a new topological phase due to the effect of spin-orbit interaction even in the absence of an external magnetic field. The topological insulator can generate pure spin current with high efficiency due to strong spin-orbit interaction and breakage of inversion symmetry at the edges.

The topological insulator is, for example, SnTe, $Bi_{1.5}Sb_{0.5}Te_{1.7}Se_{1.3}$, $TlBiSe_2$, $Bi_2Te_3$, $Bi_{1-x}Sb_x$, $(Bi_{1-x}Sb_x)_2Te_3$ and the like. The topological insulator can generate spin currents with high efficiency.

Next, a method of manufacturing the magnetic device 200 will be described. The magnetic device 200 is formed by a stacking process of each layer, and a processing process of processing a part of each layer into a predetermined shape. Each layer can be stacked, using a sputtering method, a chemical vapor deposition (CVD) method, an electron beam vapor deposition method (EB vapor deposition method), an atomic laser deposit method, or the like. Each layer can be processed, using a photolithography or the like.

Hereinafter, a method of manufacturing the vicinity of the magnetoresistance effect element 100 of the magnetic device 200 will be described using FIGS. 5 to 8. Each of FIGS. 5 to 8 is a diagram for explaining the method of manufacturing the magnetic device 200 according to the first embodiment. Upper views of FIGS. 5 to 8 are plan views as seen from the z direction, and lower views thereof are xz cross-sectional views.

Figure 5:
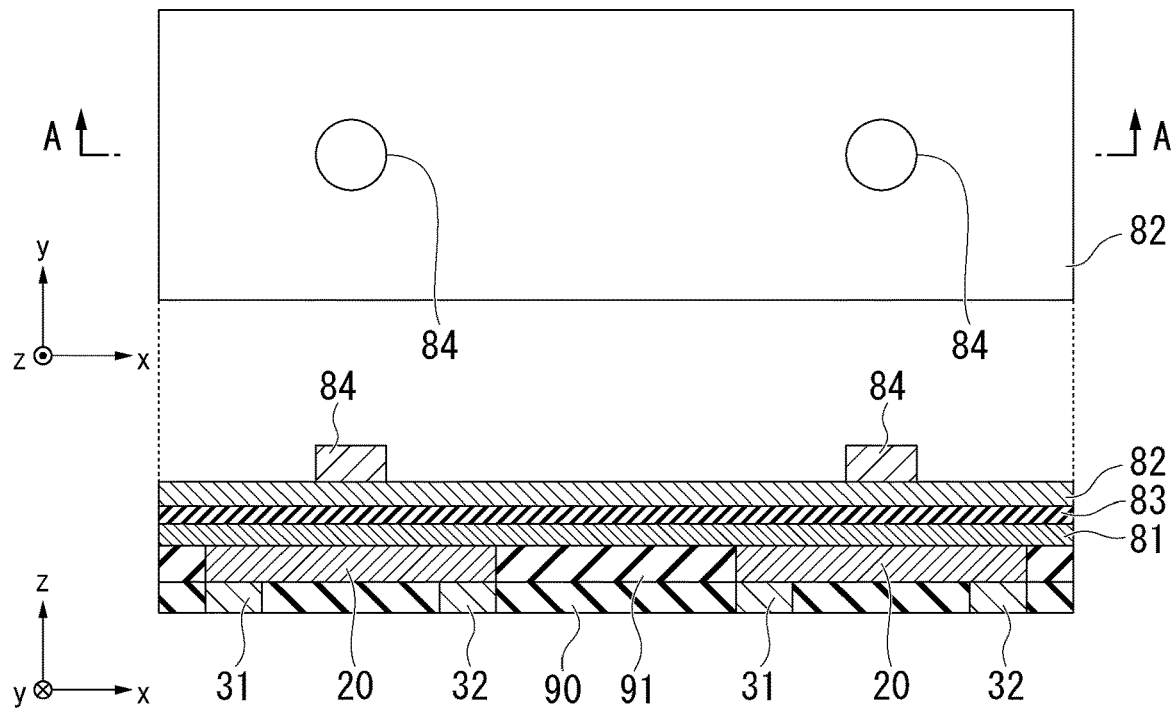
FIG. 5 is a diagram for explaining a method of manufacturing the magnetic device according to the first embodiment.

As shown in FIG. 5, an opening is formed in an insulating layer 90, and the opening is filled with a conductor to form the electrodes 31 and 32. Next, a conductive film is formed on the insulating layer 90 and the electrodes 31 and 32 and processed into a predetermined shape to form the spin-orbit torque wiring 20. Further, the periphery of the spin-orbit torque wiring 20 is filled with an insulating layer 91.

Next, an upper surface of the spin-orbit torque wiring 20 is exposed by chemical mechanical polishing (CMP). Next, the magnetic layer 81, the non-magnetic layer 83, and the magnetic layer 82 are stacked sequentially on the spin-orbit torque wiring 20 and the insulating layer 91. Further, a hard mask 84 is formed at a predetermined position on the magnetic layer 82.

Figure 6:
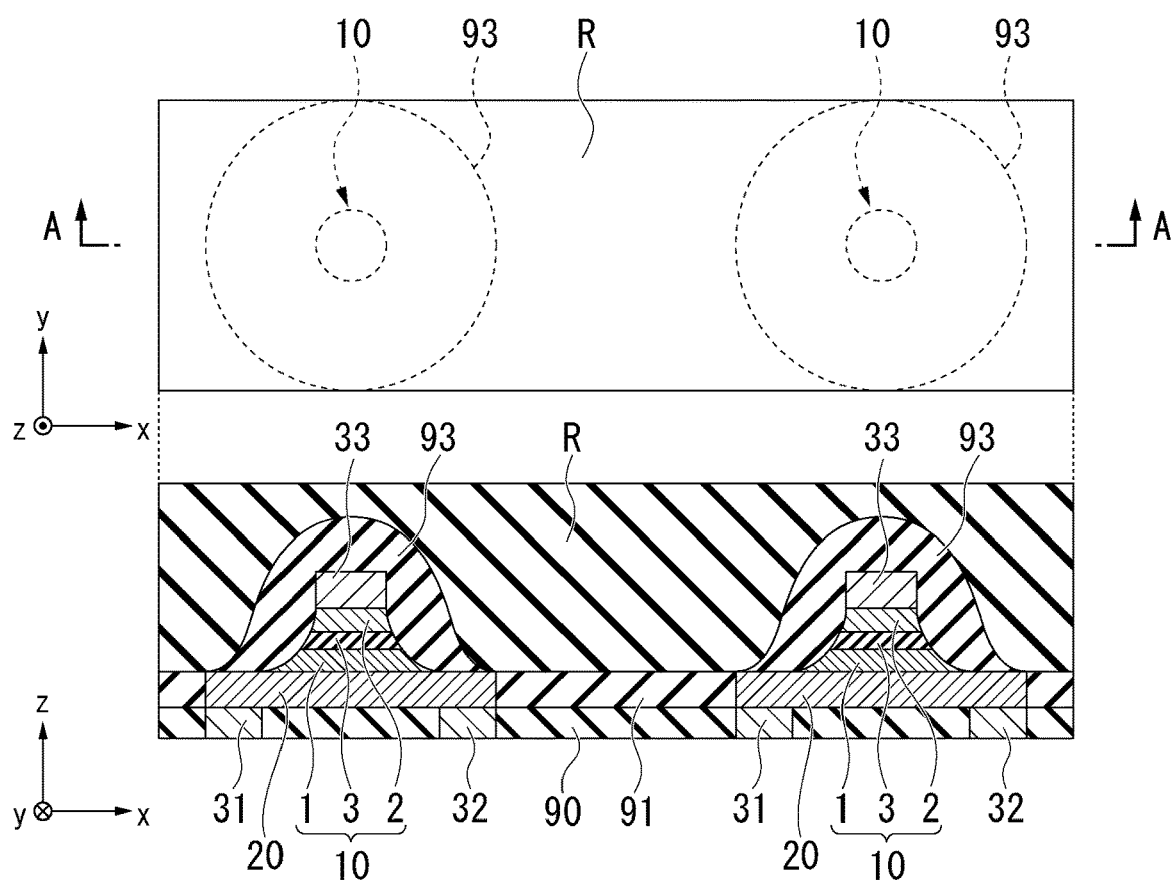
FIG. 6 is a diagram for explaining the method of manufacturing the magnetic device according to the first embodiment.

Next, the magnetic layer 81, the non-magnetic layer 83, and the magnetic layer 82 are processed via a hard mask 84. As shown in FIG. 6, the magnetic layer 81 becomes the first ferromagnetic layer 1, the non-magnetic layer 83 becomes the non-magnetic layer 3, and the magnetic layer 82 becomes the second ferromagnetic layer 2 to form the stacked body 10. The hard mask 84 becomes the electrode 33. The insulating layer 93 is formed to cover the stacked body 10 and the electrode 33, and a resist R is formed on the insulating layer 93.

Figure 7:
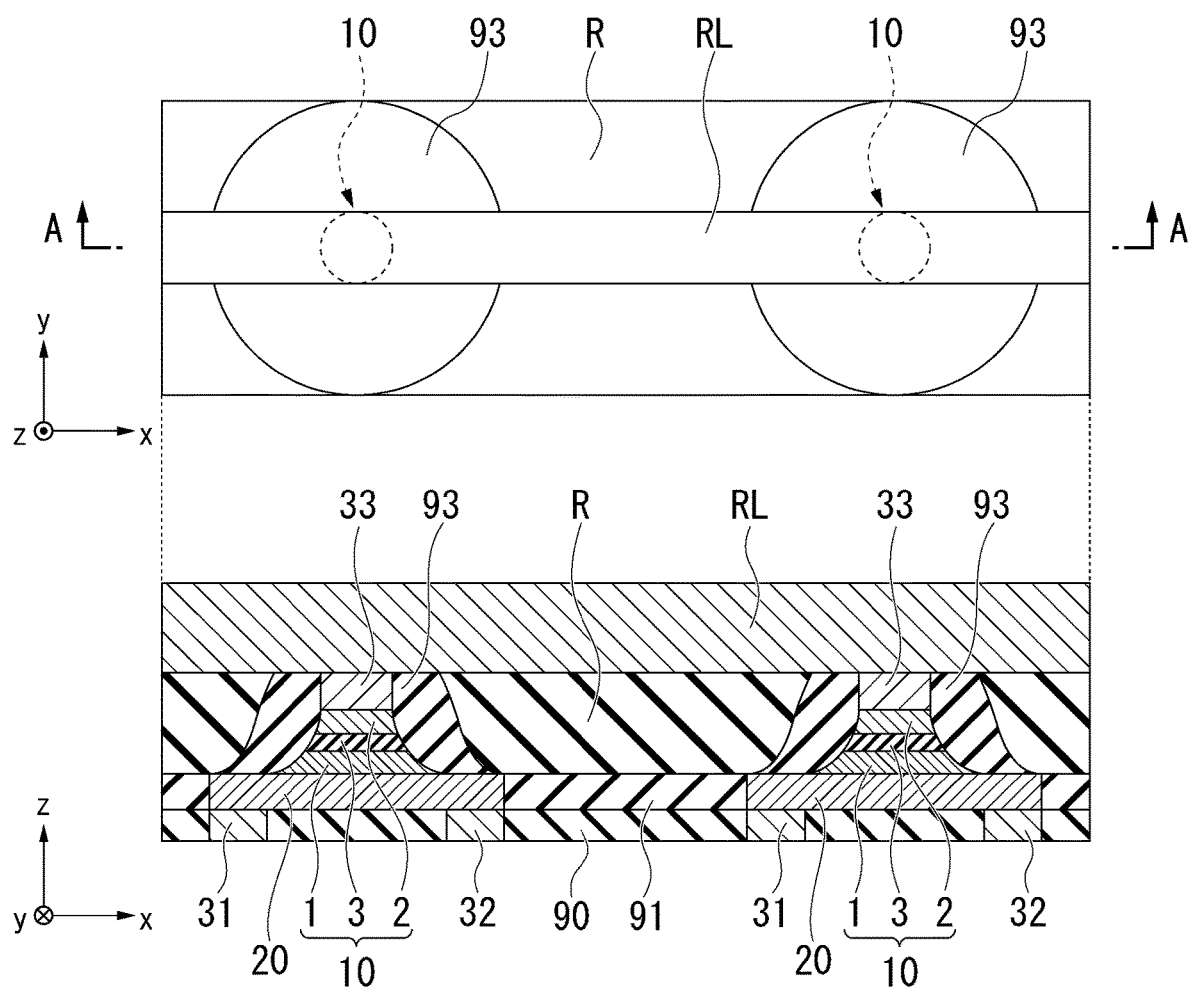
FIG. 7 is a diagram for explaining the method of manufacturing the magnetic device according to the first embodiment.

Next, the resist R and the insulating layer 93 are partially removed by chemical mechanical polishing (CMP) to expose the electrode 33. Further, a conductive layer is formed on the electrode 33, the insulating layer 93, and the resist R. By removing a part of the conductive layer, the reading line RL is formed as shown in FIG. 7. The resist R is exposed at a portion that does not overlap the reading line RL. The upper surfaces of the resist R and the insulating layer 93 may be excessively etched to be located below the lower surface of the reading line RL, at a portion that does not overlap the reading line RL.

Figure 8:
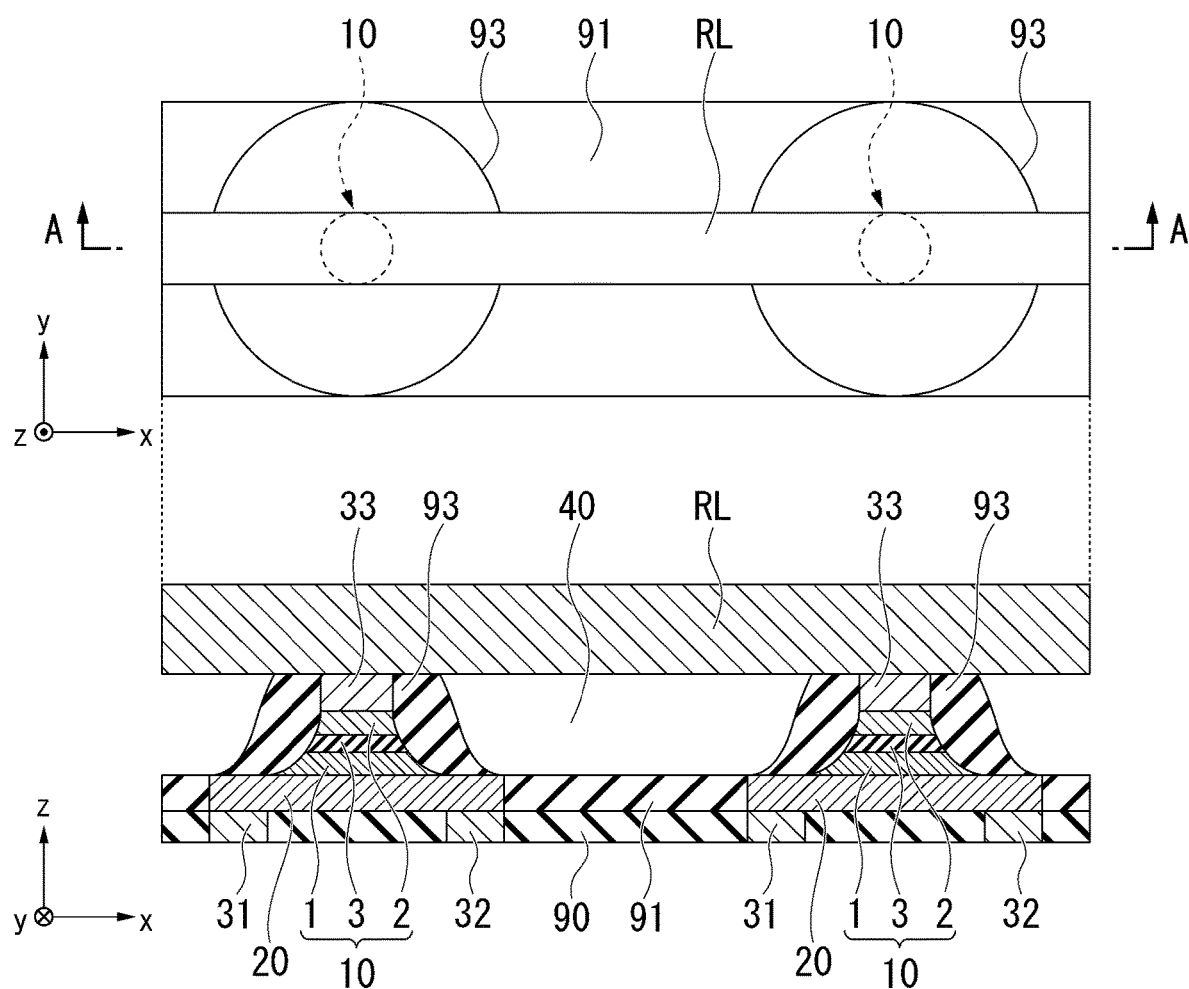
FIG. 8 is a diagram for explaining the method of manufacturing the magnetic device according to the first embodiment.

Next, as shown in FIG. 8, the resist R is removed. After removing the resist R, an insulating layer is formed on the entire surface via the reading line RL. Portions other than the portion located below the reading line RL are filled with an insulating layer, and the space 40 remains in the portion located below the reading line RL.

The insulating layers 90, 91, and 93 serve as the insulator In of FIGS. 2 and 4. By going through the procedure as described above, it is possible to obtain the magnetic device 200 having the space 40 in the insulator In.

The magnetic device 200 according to the first embodiment has a space 40 outside the stacked body 10. The space 40 is made up of air or vacuum, and has excellent heat insulating properties. The space 40 can suppress the heat generated by the stacked body 10 from being transferred to the surroundings, and can suppress the heat generated by the magnetoresistance effect element from affecting other elements.

First Modified Example

Figure 9:
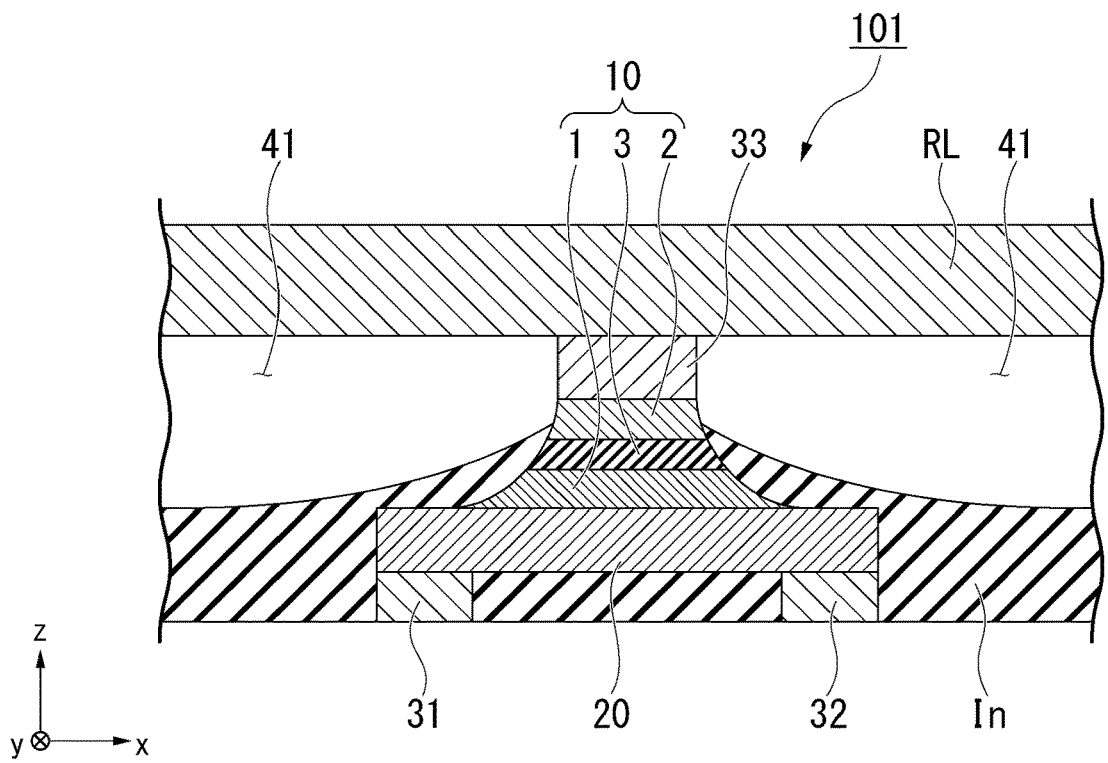
FIG. 9 is an enlarged cross-sectional view of the vicinity of the magnetoresistance effect element of a magnetic device according to a first modified example.

FIG. 9 is an enlarged cross-sectional view of the vicinity of a magnetoresistance effect element 101 of a magnetic device according to the first modified example. In FIG. 9, the same components as those in FIG. 4 are designated by the same reference numerals, and the description thereof will be omitted.

The magnetoresistance effect element 101 is coated with the insulator In. There is a space 41 in the insulator In. The space 41 is located outside the side surface of the stacked body 10. The space 41 is different from the space 40 in that a part of the space 41 is in contact with the stacked body 10. In the case the space 41 is in contact with the stacked body 10, it is possible to further suppress the heat generated in the stacked body 10 from being transferred to the surroundings. The space 41 is also in contact with the electrode 33. When the space 41 is in contact with the electrode 33, the flow of heat generated in the stacked body 10 is controlled, and most of the heat is dissipated through the electrode 33 and the reading line RL.

The magnetoresistance effect element 101 can be manufactured by controlling the thickness of the insulating layer 93 in FIG. 6.

The magnetic device according to the first modified example has the same effect as the magnetic device 200 according to the first embodiment. Further, by controlling the flow of heat generated in the stacked body 10, it is possible to suppress the influence of the heat generated in the magnetoresistance effect element on other elements.

Second Modified Example

Figure 10:
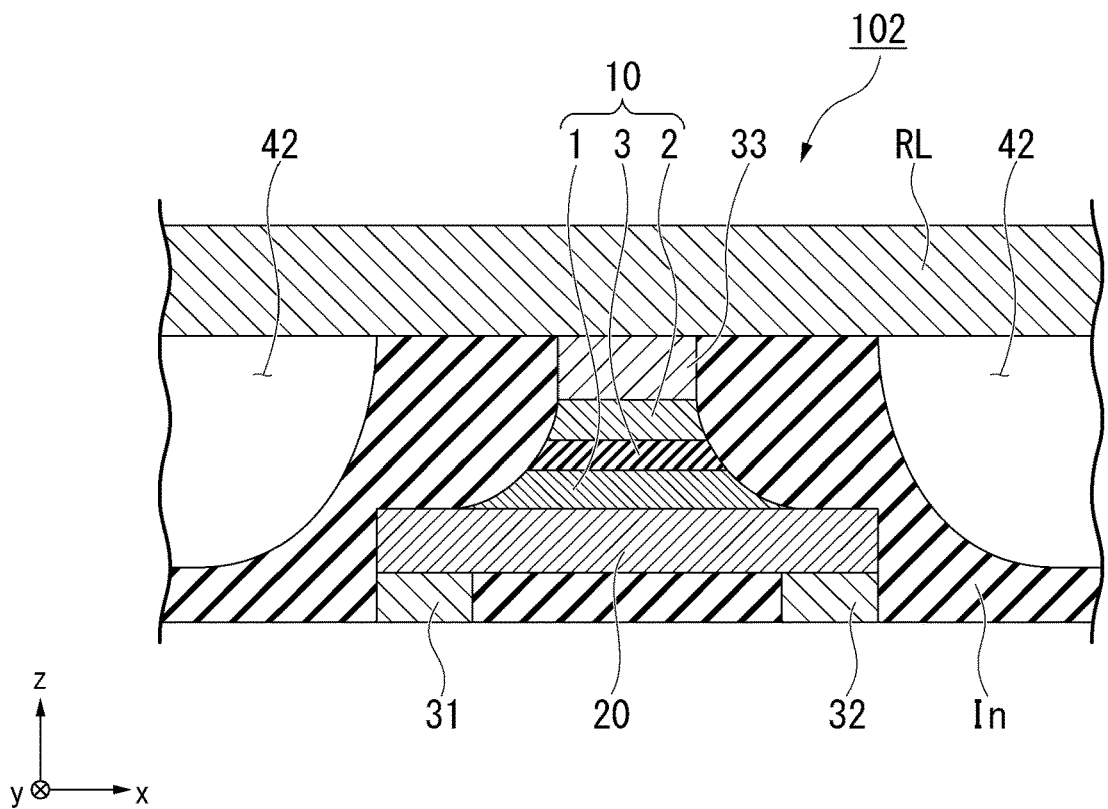
FIG. 10 is a cross-sectional view of a magnetic device according to a second modified example.

FIG. 10 is an enlarged cross-sectional view of the vicinity of a magnetoresistance effect element 102 of a magnetic device according to the second modified example. In FIG. 10, the same components as those in FIG. 4 are designated by the same reference numerals, and the description thereof will be omitted.

The magnetoresistance effect element 102 is coated with the insulator In. There is a space 42 in the insulator In. The space 42 is located outside the side surface of the stacked body 10. The space 42 differs from the space 40 in that a part of the space 42 extends below the upper surface of the spin-orbit torque wiring 20.

Figure 11:
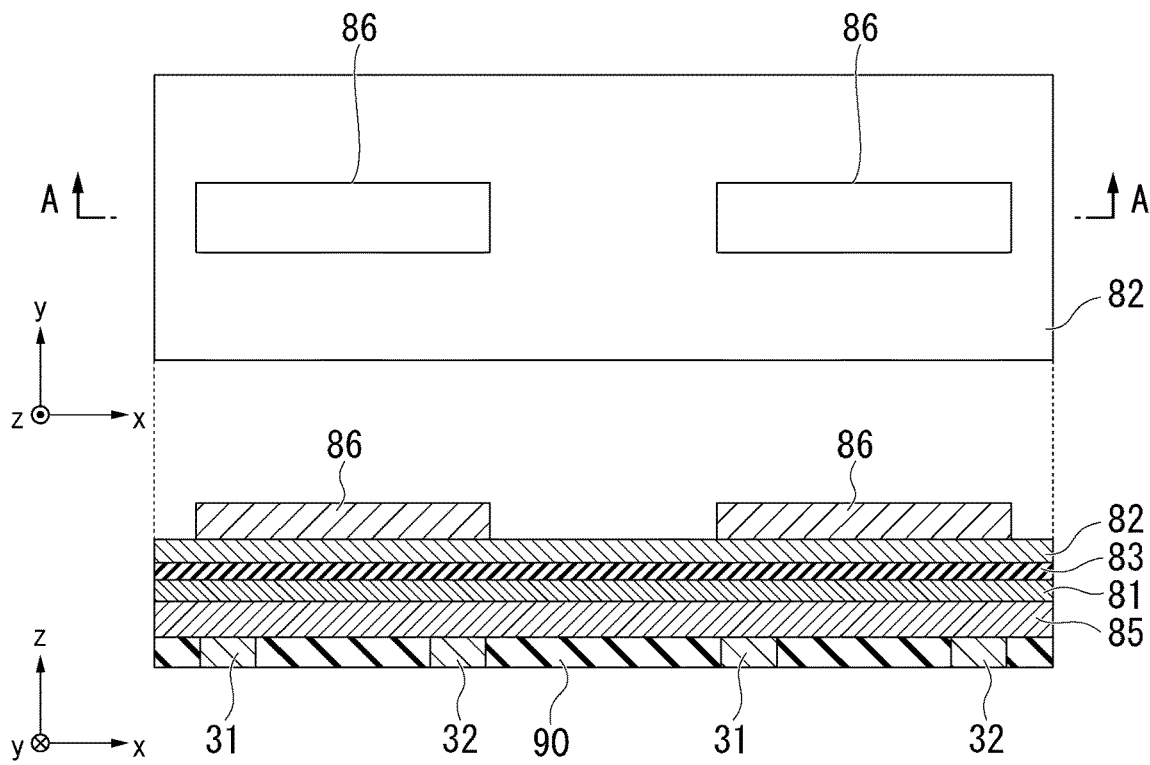
FIG. 11 is a diagram for explaining a method of manufacturing the magnetic device according to the second modified example.
Figure 12:
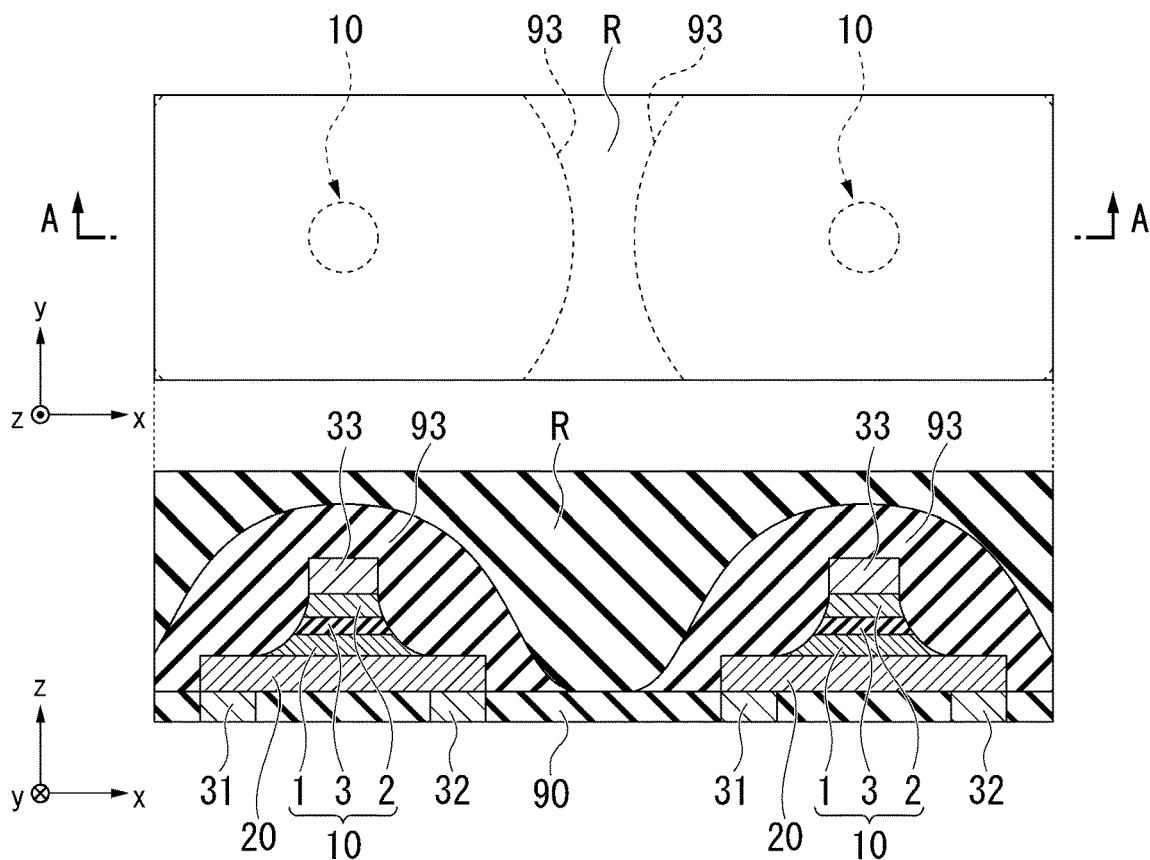
FIG. 12 is a diagram for explaining the method of manufacturing the magnetic device according to the second modified example.

FIGS. 11 and 12 are diagrams for explaining a method of manufacturing a magnetic device according to the second modified example. In the second modified example, a conductive layer 85, a magnetic layer 81, a non-magnetic layer 83, and a magnetic layer 82 are stacked sequentially on the insulating layer 90 and the electrodes 31 and 32, and are simultaneously processed via a hard mask 86. The conductive layer 85 becomes a spin-orbit torque wiring 20 by processing. Further, a hard mask is formed at a predetermined position of the magnetic layer 82 after processing, and the magnetic layer 81, the non-magnetic layer 83, and the magnetic layer 82 are processed via the hard mask to obtain the stacked body 10.

Further, as shown in FIG. 12, the insulating layer 93 and the resist R are formed to cover the stacked body 10 and the spin-orbit torque wiring 20. After that, by going through the same procedure as in FIGS. 7 and 8, the magnetic device according to the second modified example can be manufactured.

The magnetic device according to the second modified example has the same effect as the magnetic device 200 according to the first embodiment.

Third Modified Example

Figure 13:
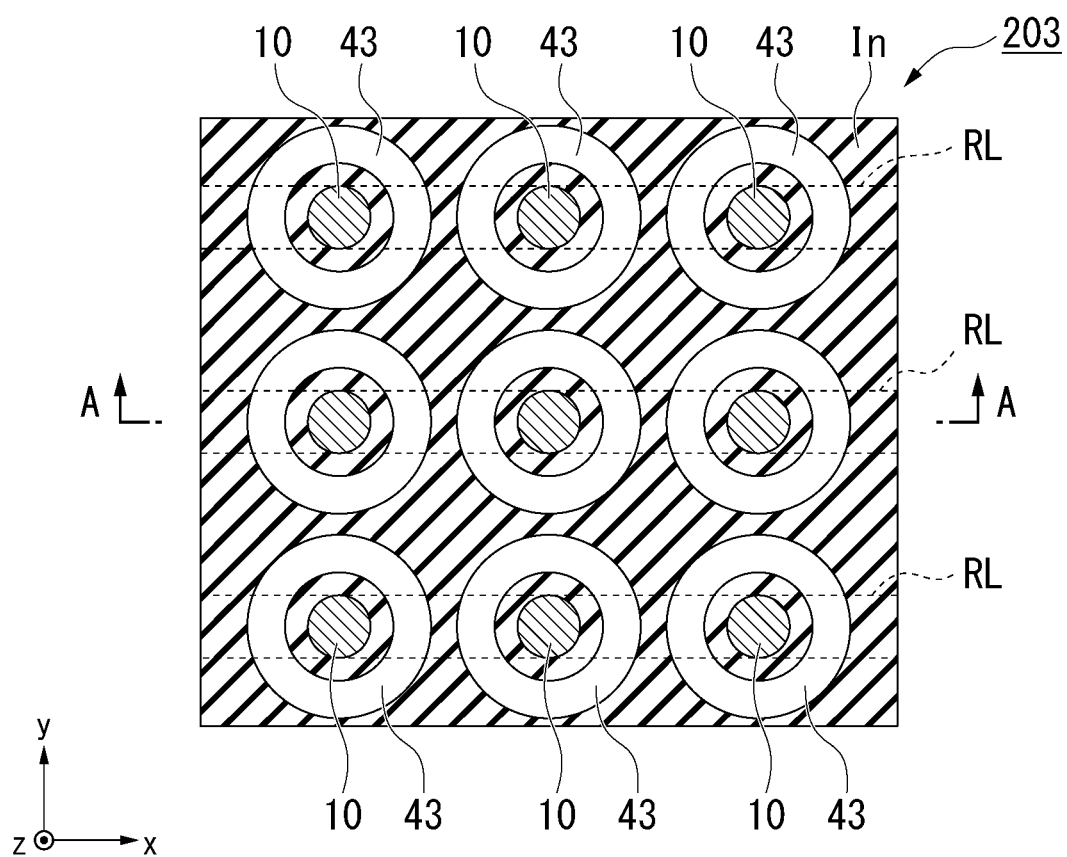
FIG. 13 is a cross-sectional view of a magnetic device according to a third modified example.

FIG. 13 is a cross-sectional view of a magnetic device 203 according to a third modified example. In FIG. 13, the same components as those in FIG. 3 are designated by the same reference numerals, and the description thereof will be omitted. FIG. 13 is a cross-sectional view of the magnetic device 203 taken along the xy plane passing through the first ferromagnetic layer 1 of the stacked body 10.

In the xy plane, the stacked bodies 10 constituting the magnetoresistance effect element are arranged in a matrix form. A space 43 surrounds the stacked body 10. The space 43 has, for example, an annular shape that surrounds the stacked body 10. Although FIG. 13 shows an example in which the space 43 surrounds the entire circumference of the stacked body 10, the space 43 may not surround the entire circumference of the stacked body 10.

Figure 14:
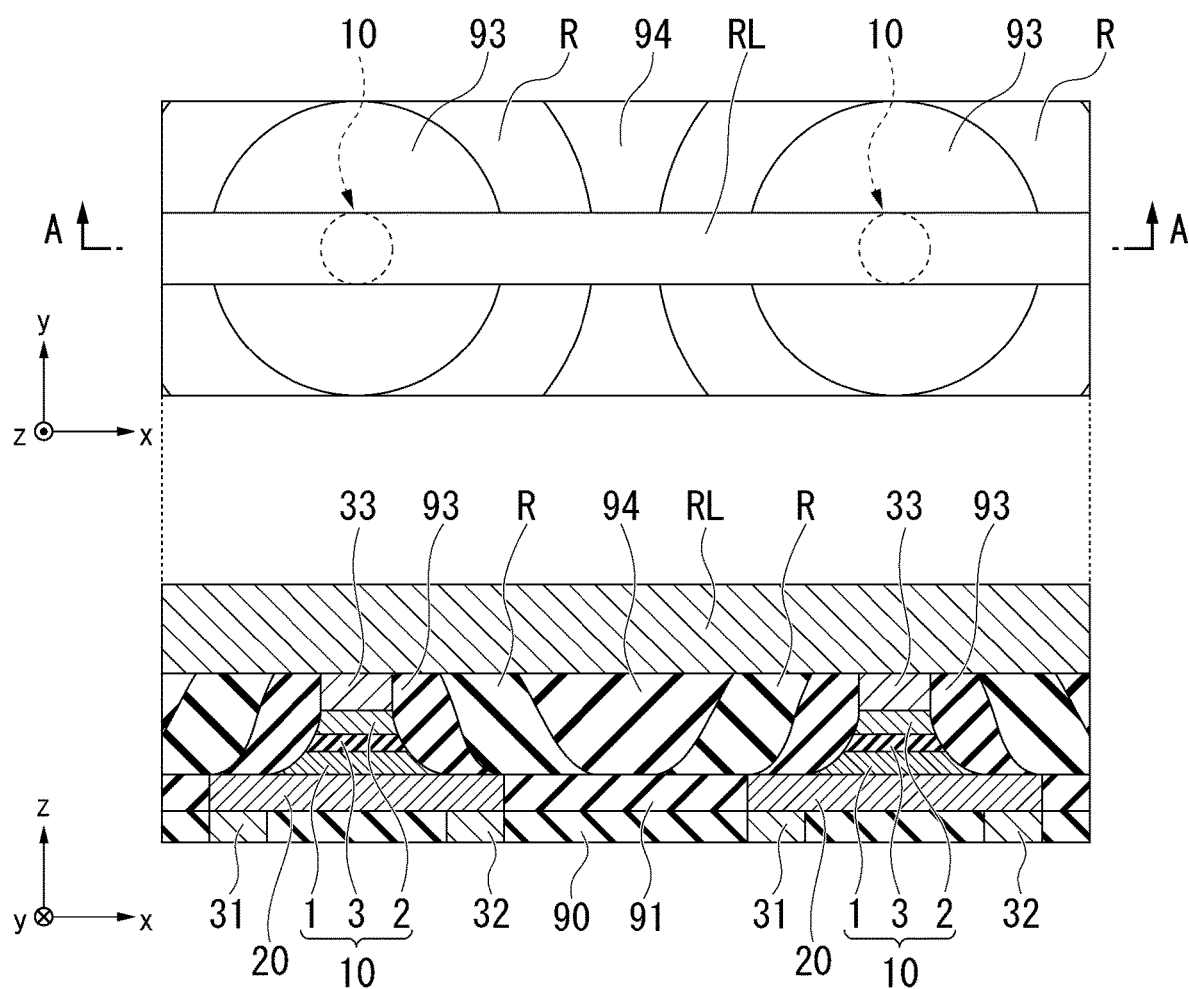
FIG. 14 is a diagram for explaining a method of manufacturing the magnetic device according to the third modified example.
Figure 15:
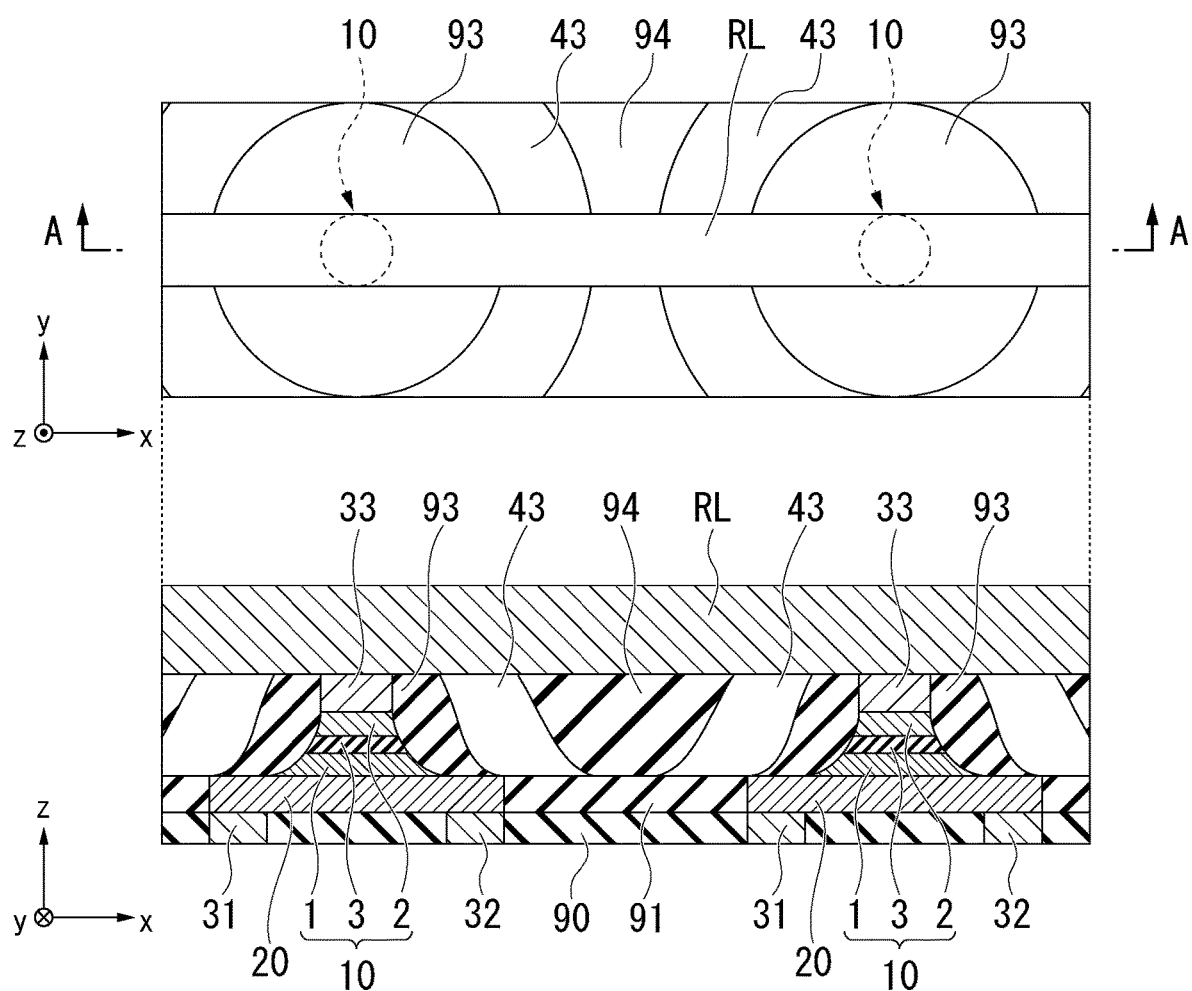
FIG. 15 is a diagram for explaining a method of manufacturing the magnetic device according to the third modified example.

FIGS. 14 and 15 are diagrams for explaining a method of manufacturing a magnetic device according to the third modified example. The third modified example is different from the first embodiment in that an insulating layer 93, a resist R, and an insulating layer 94 are stacked sequentially to cover the stacked body 10 and the electrode 33. As shown in FIG. 15, by removing the resist R, a space 43 that surrounds the stacked body 10 is formed.

The magnetic device 202 according to the third modified example has the same effect as the magnetic device 200 according to the first embodiment. Further, since the space 43 surrounds the stacked body 10, heat propagation can be further suppressed.

Second Embodiment

Figure 16:
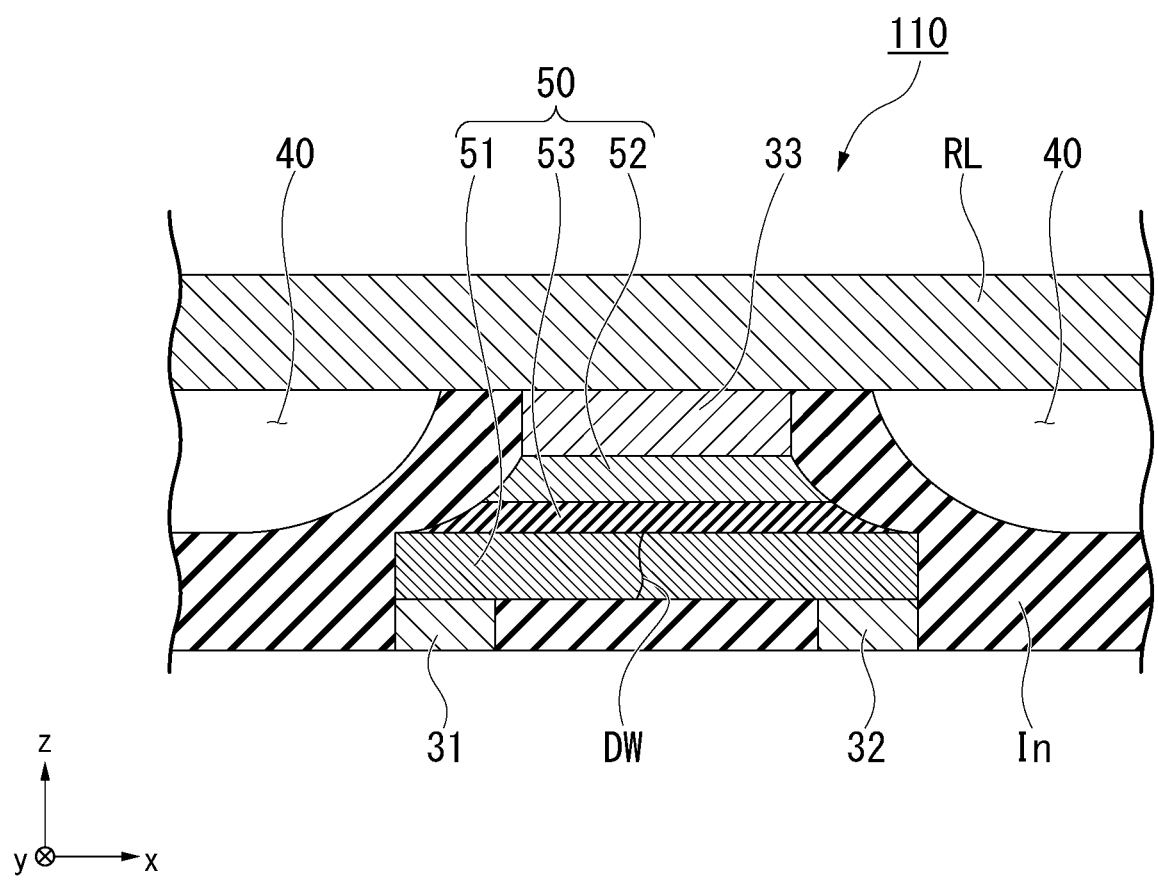
FIG. 16 is an enlarged cross-sectional view of the vicinity of a magnetoresistance effect element of a magnetic device according to a second embodiment.

FIG. 16 is an enlarged cross-sectional view of the vicinity of a magnetoresistance effect element 110 of a magnetic device according to the second embodiment. In FIG. 16, the configuration of the magnetoresistance effect element 110 is different from that of FIG. 4.

The magnetoresistance effect element 110 according to the second embodiment is made of a stacked body 50. The stacked body 50 is made up of a first ferromagnetic layer 51, a second ferromagnetic layer 52, and a non-magnetic layer 53. The non-magnetic layer 53 is located between the first ferromagnetic layer 51 and the second ferromagnetic layer 52.

The first ferromagnetic layer 51 has a domain wall DW. A resistance value of the magnetoresistance effect element 110 changes depending on the position of the domain wall DW. In some cases, the magnetoresistance effect element 110 may be referred to as a domain wall moving element.

The magnetoresistance effect element 110 is coated with the insulator In. A space 40 is located outside the side surface of the stacked body 50.

The magnetic device according to the second embodiment differs in that the magnetoresistance effect element 110 is a domain wall moving type magnetoresistance effect element, and the same effect as that of the magnetic device 200 according to the first embodiment can be obtained.

Third Embodiment

Figure 17:
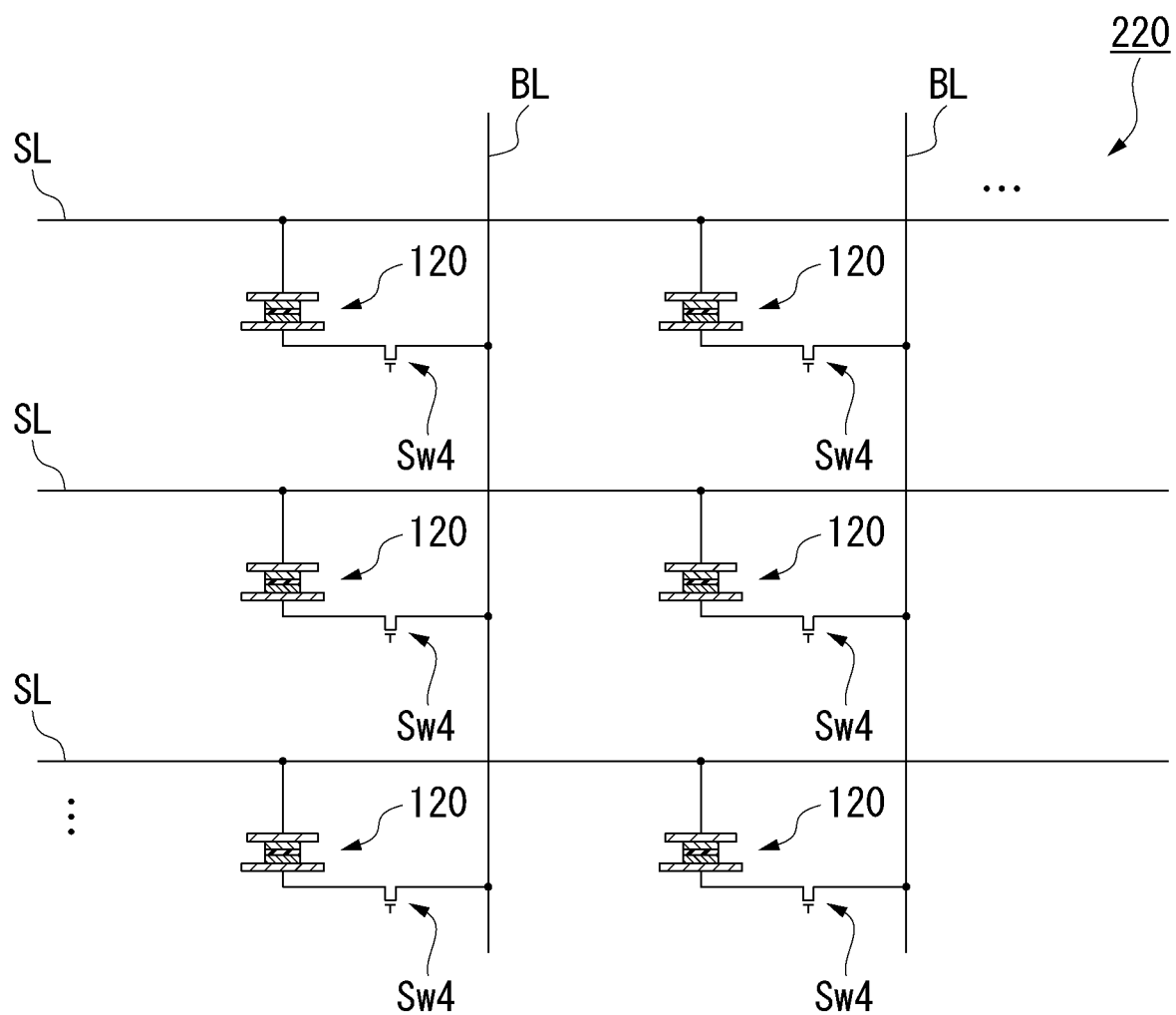
FIG. 17 is a schematic diagram of a magnetic device according to a third embodiment.

FIG. 17 is a schematic view of a magnetic device 220 according to the third embodiment. The magnetic device 220 includes a plurality of magnetoresistance effect elements 120, a plurality of source lines SL, a plurality of bit lines BL, and a plurality of fourth switching elements Sw4.

The magnetoresistance effect elements 120 are arranged, for example, in a matrix form. Each of the magnetoresistance effect elements 120 is connected to the source line SL and the bit line BL.

The flow of current to the magnetoresistance effect element 120 is controlled by the fourth switching element Sw4. The magnetoresistance effect element 120 writes and reads the data, by turning on the fourth switching element Sw4. The magnetoresistance effect element 120 writes the data, using a spin transfer torque when a current flows in the stacking direction. The fourth switching element Sw4 is the same as the first switching element Sw1 or the like.

Figure 18:
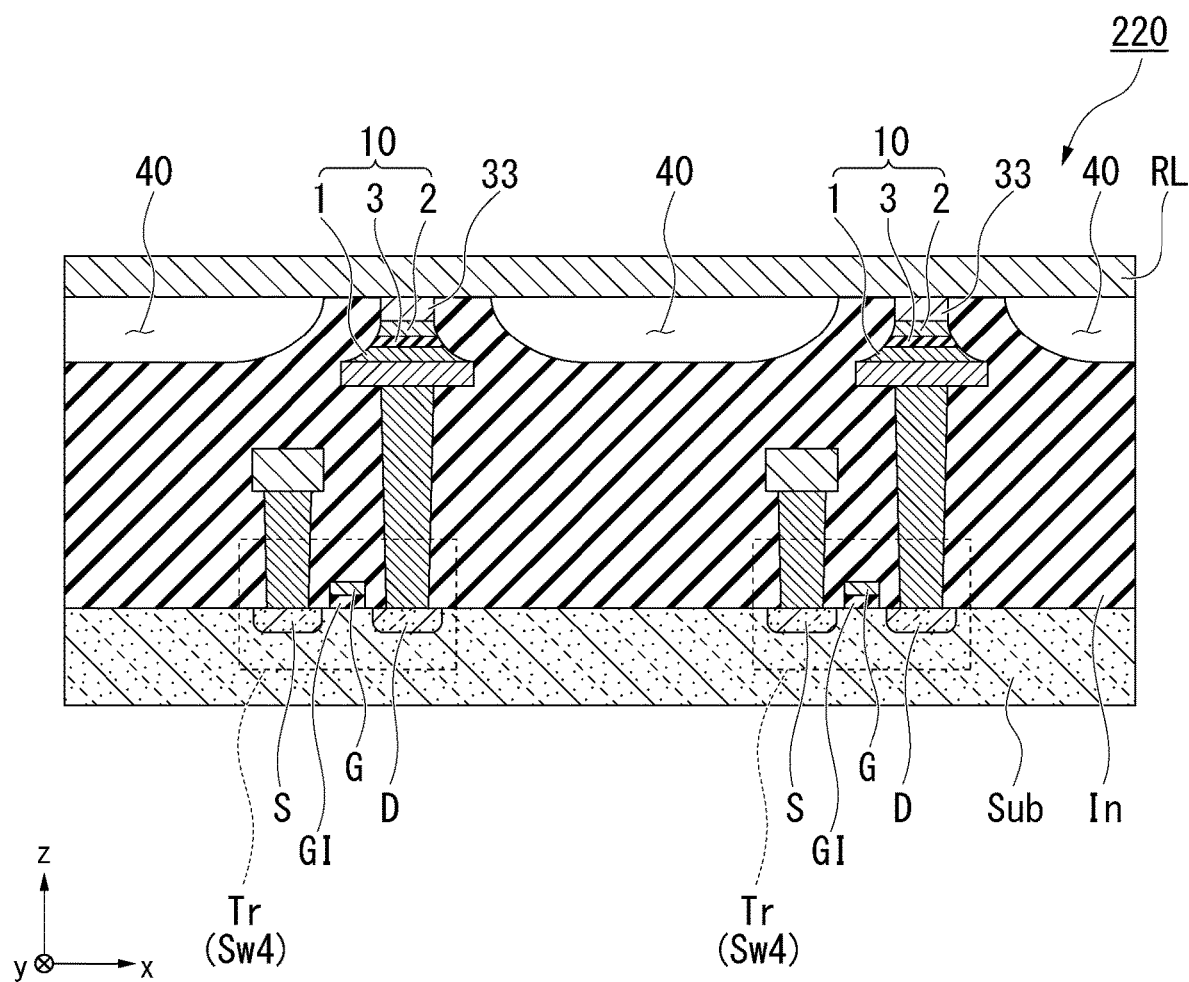
FIG. 18 is a cross-sectional view of the magnetic device according to the third embodiment.

FIG. 18 is a cross-sectional view of the magnetic device 220 according to the third embodiment. The periphery of the magnetoresistance effect element 100 and the transistor Tr is covered with the insulator In. A space 40 is formed inside the insulator In.

The magnetic device 220 according to the third embodiment differs only in that the magnetoresistance effect element is a spin transfer type magnetoresistance effect element, and the same effect as that of the magnetic device 200 according to the first embodiment can be obtained.

Although preferred embodiments of the present invention have been shown here on the basis of the first to third embodiments, the present invention is not limited to these embodiments. For example, the characteristic configurations in each embodiment and modified example may be applied to other embodiments.

EXPLANATION OF REFERENCES 1, 51 First ferromagnetic layer
2, 52 Second ferromagnetic layer
3, 53 Non-magnetic layer
10, 50 Stacked body
20 Spin-orbit torque wiring
31, 32, 33 Electrode
40, 41, 42, 43 Space
81, 82 Magnetic layer
83 Non-magnetic layer
84, 86 Hard mask
85 Conductive layer,
90, 91, 93, 94 Insulating layer
100, 101, 102, 110, 120 Magnetoresistance effect element
200, 202, 203, 220 Magnetic device
BL Bit line
CL Common line
In Insulator
RL Reading line
SL Source line
Sub Substrate Sw1 First switching element
Sw2 Second switching element
Sw3 Third switching element
Sw4 Fourth switching element
WL Writing line

What is claimed is:

1. A magnetoresistive device comprising:
a stacked body including:
   a first ferromagnetic layer;
   a second ferromagnetic layer; and
   a non-magnetic layer sandwiched between the first ferromagnetic layer and the second ferromagnetic layer; and
an insulator which covers at least a part of a side surface of the stacked body, the insulator including a vacuum or gas filled space outside the side surface of the stacked body, the vacuum or gas filled space being in direct contact with the stacked body or an electrode connected to the stacked body.

2. The magnetoresistive device according to claim 1, wherein a plurality of spaces are present inside the insulator,
   each of the plurality of spaces is the vacuum or gas filled space, and
   the stacked body is sandwiched between two of the spaces in a first direction.

3. The magnetoresistive device according to claim 2, further comprising:
   a wiring connected to the stacked body, the wiring extending in the first direction.

4. The magnetoresistive device according to claim 1, wherein the vacuum or gas filled space surrounds the side surface of the stacked body.

5. The magnetoresistive device according to claim 1, wherein a plurality of the stacked bodies are provided, and the vacuum or gas filled space is located between two stacked bodies among the plurality of stacked bodies.

6. The magnetoresistive device according to claim 5, wherein the vacuum or gas filled space is located between closest stacked bodies.

7. A magnetoresistive device comprising:
a stacked body including:
   a first ferromagnetic layer;
   a second ferromagnetic layer; and
   a non-magnetic layer sandwiched between the first ferromagnetic layer and the second ferromagnetic layer; and
an insulator which covers at least a part of a side surface of the stacked body, the insulator including a vacuum or gas filled space outside the side surface of the stacked body, the vacuum or gas filled space surrounding the side surface of the stacked body all the way around.

8. The magnetoresistive device according to claim 7, further comprising:
   a wiring connected to the stacked body, the wiring extending in a first direction.

9. The magnetoresistive device according to claim 7, wherein the vacuum or gas filled space is in contact with the stacked body.

10. The magnetoresistive device according to claim 7, further comprising:
   an electrode connected to the stacked body,
   wherein the vacuum or gas filled space is in contact with the electrode.

11. The magnetoresistive device according to claim 7, wherein a plurality of the stacked bodies are provided, and
   at least part of the vacuum or gas filled space is located between two stacked bodies among the plurality of stacked bodies.

12. The magnetoresistive device according to claim 11, wherein at least part of the vacuum or gas filled space is located between closest stacked bodies.

* * * * *